US006358667B1

(12) United States Patent
Kellett

(10) Patent No.: US 6,358,667 B1
(45) Date of Patent: *Mar. 19, 2002

(54) WATERLESS LITHOGRAPHIC PRINTING PLATES

(76) Inventor: Richard M. Kellett, 75 Elmwood Ave., Longmeadow, MA (US) 01106

(*) Notice: Subject to any disclaimer, the term of this patent is extended or adjusted under 35 U.S.C. 154(b) by 0 days.

This patent is subject to a terminal disclaimer.

(21) Appl. No.: 09/543,233

(22) Filed: Apr. 5, 2000

Related U.S. Application Data

(63) Continuation of application No. 09/082,764, filed on May 21, 1998, now Pat. No. 6,051,365.

(51) Int. Cl.[7] .............................. G03F 7/11; G03F 7/36; B41N 1/08

(52) U.S. Cl. ................. 430/271.1; 430/303; 430/289.1; 430/278.1; 430/944; 430/945

(58) Field of Search .............................. 430/303, 271.1, 430/289.1

(56) References Cited

U.S. PATENT DOCUMENTS 3,716,390 A * 2/1973 Garbarini ..................... 117/34
3,907,576 A * 9/1975 Dear et al. ..................... 106/2
3,910,187 A * 10/1975 Cords ......................... 101/450

FOREIGN PATENT DOCUMENTS

FR 2070452 * 9/1971

* cited by examiner

*Primary Examiner*—Cynthia Hamilton
(74) *Attorney, Agent, or Firm*—Sampson & Associates

(57) ABSTRACT

Provided is a media-fluid material set which comprises a media with a support that bears a hydrophilic receiving surface together with a fluid material comprising a liquid carrier medium and a reactive transition metal complex of a fluorinated organic acid. After application of the fluid material to the hydrophilic receiving surface, the reactive complex reacts to form an ink-releasing layer. Such a media-fluid material set can be advantageously used in preparing waterless lithographic printing plates with ink-releasing layers comprising such fluorinated reaction products. Also provided are imaged waterless lithographic printing plates with such ink-releasing layers made by an ink jet printing application or by laser-induced thermal ablation, and methods of making such waterless lithographic printing plates.

19 Claims, 1 Drawing Sheet

WATERLESS LITHOGRAPHIC PRINTING PLATES

RELATED APPLICATION

This application is a continuation of U.S. patent application Ser. No. 09/082,764, filed May 21, 1998, now U.S. Pat. No. 6,051,365.

TECHNICAL FIELD

The present invention relates generally to the field of waterless lithographic printing plates. More particularly, the present invention pertains to a media and fluid material set which comprise (a) a media with a support that bears a hydrophilic receiving surface; and, (b) a fluid material comprising a liquid carrier medium and a reactive component, which comprises a transition metal complex of a fluorinated organic acid. The reactive component reacts after application of the fluid material to the hydrophilic receiving surface to form an ink-releasing layer on the receiving surface. The present invention also pertains to waterless lithographic printing plates with such ink-releasing layers which are suitable for imaging by laser-induced thermal ablation and to imaged waterless lithographic printing plates with such ink-releasing layers, made by an ink jet printing application, by laser-induced thermal ablation, or by other imaging processes, and methods of making such waterless lithographic printing plates.

BACKGROUND

As printing plate technology has steadily evolved in recent years from analog imaging materials and methods to digital imaging materials and methods, a number of imaging techniques capable of use in digital printing have been described for use in computer-to-plate imaging systems. Examples of these digital printing technologies for computer-to-plate applications include laser printing, laser-induced thermal ablation imaging, and ink jet printing.

Throughout this application, various publications, patents, and published patent applications are referred to by an identifying citation. The disclosures of the publications, patents, and published patent applications referenced in this application are hereby incorporated by reference into the present disclosure to more fully describe the state of the art to which this invention pertains.

Exemplary of laser printing techniques for computer-to-plate applications is U.S. Pat. No. 5,304,443 to Figov. Examples of laser-induced thermal ablation techniques for computer-to-plate applications include U.S. Pat. Nos. 5,353,705 and 5,487,338 both to Lewis et al., and U.S. Pat. Nos. 5,605,780 and 5,691,114, both to Burberry et al. U.S. Pat. Nos. 4,003,312 to Gunther, U.S. Pat No. 4,833,486 to Zerillo, U.S. Pat No. 5,312,654 to Arimatsu, et al, U.S. Pat. No. 5,501,150 to Leenders et al., U.S. Pat. Nos. 5,738,013 and 5,849,066, both to Kellett, Japanese Kokai 62-25081 to Katagiri et al., and EP 776,763A1 to Hallman et al. are examples of ink jet printing techniques suitable for computer-to-plate applications.

Lithographic printing has long been a widely used printing technique. By the term "lithographic," as used herein, is meant to include various terms used synonymously, such as offset, offset lithographic, planographic, and others. Much effort has been directed at developing computer-to-plate imaging techniques for providing lithographic printing plates. These efforts have been made for both of the main types of lithographic printing plates: wet lithographic printing plates and dry or waterless printing plates.

By the term "wet lithographic," as used herein, is meant the type of lithographic printing plate where the inking or image areas of the plate that receive the printing ink from the ink roller and then transfer this ink to the receiving media, such as a type of paper, are ink-receptive or oleophilic and where the non-inking or background areas of the plate that do not accept printing ink from the ink roller and thus do not transfer any ink to the receiving media are hydrophilic and receive an aqueous fountain solution during the printing process before contact with the ink roller. This aqueous or "wet" layer in the non-inking areas renders these areas ink repellent or oleophobic to the printing ink.

By the terms "dry lithographic" or "waterless lithographic," as used herein, is meant the type of lithographic printing plate where the inking or image areas of the plate that receive the printing ink from the ink roller and then transfer this ink to the receiving media are ink-receptive and where the non-inking or background areas of the plate that do not accept printing ink from the ink roller and thus do not transfer any ink to the receiving media are ink-releasing in a "dry" or "waterless" state and do not utilize a "wet" solution of any type, such as an aqueous fountain or dampening solution, to render the non-inking areas repellent to the printing ink. Thus, the dry or waterless lithographic printing process has an advantage over the wet lithographic printing process in that the operator does not have the additional variable of an aqueous fountain solution to identify as suitable for the specific printing operation and then to have to maintain during the course of the printing operation. This advantage from simpler equipment, processing, and printing solution and other setup requirements is particularly useful in computer-to-plate lithographic printing where a fast setup and turnaround time for the printing run is highly desirable to achieve the overall printing speed and convenience possible from computer-to-plate based printing systems.

For waterless lithographic printing, the ink-releasing material in non-inking areas of the plate is typically a material of low surface energy, such as surface tension below about 20 dynes/cm, which makes the layer abhesive or repellent to the oil-based waterless printing inks as well as to aqueous dampening solutions. To provide this low surface energy, elastomeric silicone polymer materials are commonly used for waterless lithographic printing plates, as for example, described in U.S. Pat. No. 4,259,905 to Abiko et al., U.S. Pat. No. 5,017,457 to Herrman et al., and U.S. Pat. No. 5,212,048 to Lewis et al. Computer-to-plate printing for use in waterless lithographic printing is known, as, for example, described in U.S. Pat. Nos. 5,310,869, 5,339,737, 5,540,150 and 5,551,341, all to Lewis et al., for laser-induced thermal ablation and in U.S. Pat. No. 4,003,312 to Gunther for ink jet printing. Some disadvantages of silicone materials for waterless lithographic plates include poor adhesion of the silicone-containing layer to support materials, such as aluminum plates, and soft and elastomeric properties which may interfere with the durability needed for long press runs, such as over 50,000 impressions, and which may not cleanly release the elastomeric and somewhat tacky waterless printing inks to provide high resolution and consistent image quality. To overcome the intrinsic abhesive properties of the silicone materials, one or more additional layers have been utilized to improve the adhesion to the support material. Thus, it would be desirable to have a tough, durable material with good adhesion to the support material and with excellent ink-releasing properties for use in various computer-to-plate systems to prepare waterless lithographic plates, particularly those capable of long production runs of 50,000 impressions and more with a consistent image quality.

As an alternative to silicone materials as the low surface energy materials for the ink-releasing areas in waterless lithographic plates, fluorinated materials have been reported, such as, for example, in U.S. Pat. No. 3,859,090 to Yoerger et al., which describes a fluorinated acrylate polymer with a fluorinated or silicone oil in an ink repellent composition for waterless plates.

An ink-releasing material, which is applicable for waterless lithographic printing plates and provides a tough, durable layer with excellent ink-releasing properties, and which may be utilized in computer-to-plate imaging processes, such as laser-induced thermal ablation and ink jet printing, would be of great value to the printing industry.

SUMMARY OF THE INVENTION

One aspect of the present invention pertains to a media/fluid material set for use in preparing a waterless lithographic printing plate, which media/fluid material set comprises (a) a media comprising a support that bears a hydrophilic receiving surface; and, (b) a fluid material comprising a liquid carrier medium and a transition metal complex of a fluorinated organic acid, wherein the complex reacts after application of the fluid material on the hydrophilic receiving surface and thereby forms an ink-releasing layer on the receiving surface. In a preferred embodiment, the reactive complex of this invention comprises a chromium complex of a fluorinated organic acid, and more preferably, a Werner complex of trivalent chromium and a fluorinated organic acid. In a most preferred embodiment, the fluorinated organic carboxylic acid of the Werner complex of the media/fluid material set of this invention is selected from the group consisting of non-cyclic and cyclic carboxylic acids having 4 to 18 carbon atoms.

In one embodiment, the fluid material of the present invention is an ink jet fluid marking material, and the application method utilized for the fluid material is an ink jet printing application, and preferably, the ink jet printing application is in a desired imagewise pattern, thereby forming an ink-releasing layer in the desired imagewise pattern on the hydrophilic surface of the support.

In one embodiment, the hydrophilic receiving surface of the media of this invention further comprises a catalyst to increase the rate of reaction, and preferably, the catalyst is an alkaline material.

In one embodiment, the hydrophilic receiving surface of the media of the present invention comprises a hydrophilic material selected from the group consisting of: polyvinyl alcohol and copolymers thereof; cellulosic polymers; polyacrylates and copolymers thereof; polymethacrylates and copolymers thereof; polymaleic anhydrides and derivatives and copolymers thereof; polyvinyl pyrrolidones and copolymers thereof; quaternary ammonium polymers and copolymers thereof; polyamides; and aluminum oxides, and preferably, the aluminum oxides are selected from the group consisting of: aluminum boehmites; gamma-aluminum oxides; alpha-aluminum oxides; aluminum oxides formed by the oxidation of aluminum metal by oxygen; and aluminum oxides formed by an anodization process.

In a preferred embodiment, the transition metal complex of the fluid material of the present invention reacts upon exposure to heat after application of the fluid material on the hydrophilic receiving surface, and most preferably, the complex reacts with the hydrophilic receiving surface.

In one embodiment, the support of the media of the present invention is a paper. In one embodiment, the support of the media of this invention is a polymeric plastic film. In one embodiment, the support of the media of the present invention is aluminum.

One aspect of the present invention pertains to an ink-releasing plate for preparing a waterless lithographic printing plate, which plate comprises (a) a support that bears a hydrophilic surface; and, (b) an ink-releasing layer overlying the hydrophilic surface of the support, wherein the ink-releasing layer comprises a reaction product of a transition metal complex of a fluorinated organic acid. In one embodiment, the ink-releasing layer further is capable of being imaged using laser-induced thermal ablation, wherein the ablation removes the ink-releasing layer in exposed regions thereof to thereby reveal the hydrophilic surface of the support. In a preferred embodiment of the ink-releasing plates of this invention, the transition metal complex is a chromium complex, and more preferably, the complex comprises a Werner complex of trivalent chromium and a fluorinated organic carboxylic acid. In a most preferred embodiment, the fluorinated organic carboxylic acid of the Werner complex of the ink-releasing plates of this invention is selected from the group consisting of non-cyclic and cyclic carboxylic acids having 4 to 18 carbon atoms.

In one embodiment, the ink-releasing layer of the ink-releasing plates of this invention further comprises a sensitizer to increase the rate of imaging by laser-induced thermal ablation, and preferably, the sensitizer is an infrared-absorbing material.

One aspect of the present invention pertains to an imaged waterless lithographic printing plate comprising (a) a support that bears a hydrophilic surface in the ink-receiving areas of the support; and, (b) an ink-releasing layer in a desired imagewise pattern overlying the hydrophilic surface of the support, wherein the ink-releasing layer comprises a reaction product of a transition metal complex of a fluorinated organic acid. In a preferred embodiment of the imaged waterless lithographic plates of the present invention, the transition metal complex is a chromium complex, and more preferably, the chromium complex comprises a Werner complex of trivalent chromium and a fluorinated organic carboxylic acid. In a most preferred embodiment, the fluorinated organic carboxylic acid of the Werner complex of the imaged plates of this invention is selected from the group consisting of noncyclic and cyclic carboxylic acids having 4 to 18 carbon atoms.

In one embodiment of the imaged waterless lithographic plates of this invention, the hydrophilic surface in the ink-receiving areas of the support comprises a hydrophilic material selected from the group consisting of: polyvinyl alcohol and copolymers thereof; cellulosic polymers; polyacrylates and copolymers thereof; polymethacrylates and copolymers thereof; polymaleic anhydrides and derivatives and copolymers thereof, polyvinyl pyrrolidones and copolymers thereof; quaternary ammonium polymers and copolymers thereof; polyamides; and aluminum oxides; and preferably, the aluminum oxides are selected from the group consisting of: aluminum boehmites; gamma-aluminum oxides; alpha-aluminum oxides; aluminum oxides formed by the oxidation of aluminum metal by oxygen; and aluminum oxides formed by an anodization process. In a most preferred embodiment, the reaction product in the ink-releasing layer comprises a reaction product of the transition metal complex of a fluorinated organic acid with the hydrophilic surface of the support.

In one embodiment, the support of the imaged plates of the present invention is a paper. In one embodiment, the support of the imaged plates of this invention is a polymeric plastic film. In one embodiment, the support of the imaged plates of the present invention is aluminum.

One aspect of the present invention pertains to a method of preparing an ink-releasing plate for use in preparing a waterless lithographic printing plate, which method comprises the steps of (a) providing a support that bears a hydrophilic receiving surface; (b) applying a fluid material comprising a liquid carrier medium and a transition metal complex of a fluorinated organic acid to the hydrophilic receiving surface; (c) removing the liquid carrier medium; and (d) reacting the transition metal complex, thereby forming an ink-releasing layer on the receiving surface. In a preferred embodiment, the transition metal complex reacts in step (d) upon exposure to heat, and most preferably, the transition metal complex reacts in step (d) with the hydrophilic receiving surface. In a preferred embodiment of the method of preparing an ink-releasing plate of this invention, the transition metal complex is a chromium complex of a fluorinated organic acid, and more preferably, the chromium complex comprises a Werner complex of trivalent chromium and a fluorinated organic carboxylic acid. In a most preferred embodiment of the method of preparing an ink-releasing plate of this invention, the fluorinated organic carboxylic acid of the Werner complex is selected from the group consisting of non-cyclic and cyclic carboxylic acids having 4 to 18 carbon atoms.

In one embodiment of the method of preparing an ink-releasing plate of the present invention, the fluid material is an ink jet fluid marking material and the application of the fluid material to the hydrophilic receiving surface is carried out by an ink jet printing application.

One aspect of the present invention pertains to methods of preparing an imaged waterless lithographic printing plate, comprising providing a lithographic plate blank having a support that bears a hydrophilic receiving surface and forming an image on the hydrophilic receiving surface of the support with an ink jet printer in an ink jet printing application, wherein an ink jet fluid marking material utilized in the ink jet printer comprises a liquid carrier medium and a reactive component, which reactive component comprises a transition metal complex of a fluorinated organic acid. The transition metal complex reacts upon exposure to an energy source after the ink jet printing application, thereby forming an effective amount of an ink-releasing layer in a desired pattern on the support. In a preferred embodiment of the methods of preparing imaged waterless plates of this invention, the transition metal complex is a chromium complex of a fluorinated organic acid, and more preferably, the chromium complex comprises a Werner complex of trivalent chromium and a fluorinated organic carboxylic acid. In a most preferred embodiment of the methods of preparing imaged waterless plates of the present invention, the fluorinated organic carboxylic acid is selected from the group consisting of non-cyclic and cyclic carboxylic acids having 4 to 18 carbon atoms.

In one embodiment of the methods of making imaged waterless lithographic plates of the present invention, the ink jet printing application is done in a desired imagewise pattern and the ink-releasing layer is formed in a desired imagewise pattern on the support. In a preferred embodiment, the energy source is heat, and most preferably, the transition metal complex reacts with the hydrophilic receiving surface. In one embodiment, the support is a paper. In one embodiment, the support is a polymeric plastic film. In one embodiment, the support is aluminum.

One aspect of the present invention pertains to a method for preparing an imaged waterless lithographic printing plate, which method comprises the steps of (a) providing a support that bears a hydrophilic receiving surface; (b) applying a fluid material comprising a liquid carrier medium and a reactive component to the receiving surface, wherein the reactive component comprises a transition metal complex of a fluorinated organic acid; (c) removing the liquid carrier medium; (d) reacting the reactive component, thereby forming an ink-releasing layer on the receiving surface; and, (e) exposing the ink-releasing layer to laser-induced thermal ablation in a desired imagewise pattern, thereby removing the ink-releasing layer in the exposed regions thereof to thereby reveal the hydrophilic surface of the support in the desired imagewise pattern.

As one of skill in the art will appreciate, features of one embodiment and aspect of the invention are applicable to other embodiments and aspects of the invention.

DETAILED DESCRIPTION OF THE INVENTION

Figure 1:
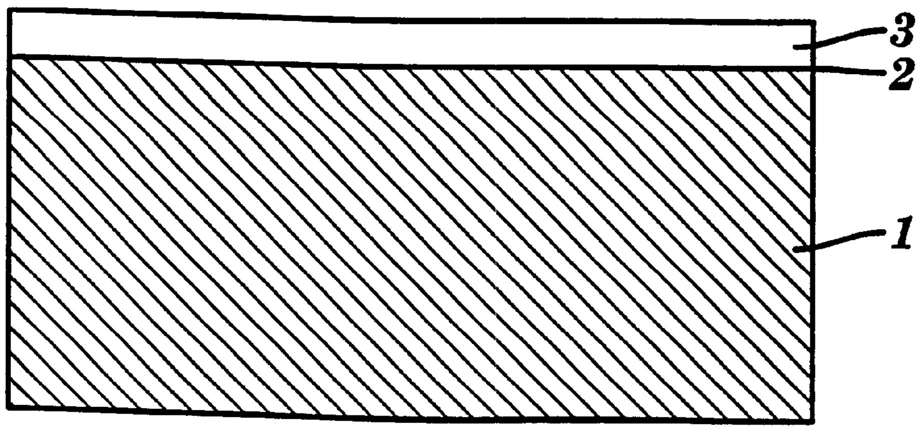
FIG. 1 shows a cross-section of an ink-releasing plate of the present invention for use in preparing waterless lithographic printing plates.

One aspect of the present invention pertains to a media/fluid material set for use in waterless lithographic printing plates, which media/fluid material set comprises (a) a media comprising a support that bears a hydrophilic receiving surface; and, (b) a fluid material comprising a liquid carrier medium and a reactive component, which reactive component comprises a transition metal complex of a fluorinated organic acid, wherein the complex reacts after the application of the fluid material on the hydrophilic receiving surface and thereby forms an ink-releasing layer on the receiving surface. The media/fluid material sets of the present invention are particularly preferred for use in waterless lithographic printing plates imaged by laser-induced thermal ablation or, alternatively, by an ink jet printing application.

Transition Metal Complexes of Fluorinated Organic Acids

The term "transition metal," as used herein, means the elements of the First, Second, and Third Transition Metal Series of Groups IB to VIIIB in the Periodic Table and includes, but is not limited to, Cr, Zn, Sn, Fe, Co, V, Ti, Ni, Cu, Y, Zr, Nb, Mo, Ru, Rh, Pd, Hf, Ag, Pt, Hg, Ta, W, Re, Os, Ir, and Mn. The term "complexes" or "complex," according to the *McGraw Hill Dictionary* of scientific Terms, Fifth Edition, McGraw Hill, Inc., New York, 1994, and as used herein, means those components in which a part of the molecular bonding is of the coordinate type in which a chemical bond between two atoms is formed by a shared pair of electrons, and the pair of electrons has been supplied by one of the two atoms. One of the two atoms in the coordinate type bond is a transition metal in the complexes of the present invention.

The term "fluorinated organic acids," as used herein, means acids having carbon atoms in the molecule and having one or more fluorine atoms in the molecule. Suitable fluorinated organic acids include, but are not limited to, fully fluorinated or perfluorinated organic acids where all the carbon atoms in the molecule, except for any carbon atoms that are part of the acidic functional group, are bonded only to either a fluorine atom or to another carbon atom, such as, for example, 2,2,3,3,3-pentafluoropropionic acid; and partially fluorinated organic acids where some of the fluorine atoms in a perfluorinated organic acid are substituted with hydrogen or some other atom besides fluorine, such as, for example, 3,3,3-trifluoropropionic acid or 3-fluoropropionic acid. The acidic functional groups of the fluorinated organic acids of the present invention may be any known in the art and include, but are not limited to, carboxylic acid groups, sulfonic acid groups, and phosphoric acid groups.

The transition metal elements, such as chromium, have a large atomic radius and exist in highly charged ionic states, such as trivalent chromium. As such, these transition metal elements readily form complexes with a wide variety of compounds, such as, for example, organic acids and water. The use of transition metal elements provides an effective approach to use to form stable complexes of potentially reactive materials which may be conveniently applied to a desired surface and then reacted by an external energy source or by another method, such as exposure to a catalyst or to another material that reacts with the complex, to form a reaction product with desirable properties, such as low surface energy and durability.

In a preferred embodiment of the media/fluid material sets of the present invention, the transition metal complex of a fluorinated organic acid is a chromium complex. In a more preferred embodiment, the chromium complex comprises a Werner complex of trivalent chromium and a fluorinated organic carboxylic acid. The Werner complexes of trivalent chromium and non-fluorinated organic carboxylic acids are well known commercial products as, for example, the Werner complexes of trivalent chromium and myristic or stearic acid in isopropyl alcohol, as described in *Quilon Chrome Complexes*, Dupont Corporation, April 1992. Suitable chromium complexes of the present invention, and methods for preparing these chromium complexes, include, but are not limited to, the Werner complexes of trivalent chromium and fluorinated organic carboxylic acids and processes for preparing them, as disclosed in U.S. Pat. Nos. 2,665,835 to Reid, U.S. Pat. No. 2,904,571 to LeFluer, U.S. Pat. No. 3,287,141 to Bartz, and U.S. Pat. No. 3,907,576 to Dear et al. The Werner complexes of this invention may be complexes of trivalent chromium and a mixture of fluorinated organic carboxylic acids, as for example, described in U.S. Pat. No. 3,907,576. In a most preferred embodiment, the fluorinated organic carboxylic acid of the Werner complexes of the media/fluid material sets of this invention is selected from the group consisting of non-cyclic and cyclic carboxylic acids having 4 to 18 carbon atoms, such as, for example, the trivalent chromium complex of perfluorinated decanoic acid and the trivalent chromium complex of 3,3,4,4,5,5,6,6,7,7,8,8,8-tridecafluorooctanoic acid.

Media/Fluid Material Sets

The fluid materials of the media/fluid material sets for use in preparing waterless lithographic plates of the present invention comprise a liquid carrier medium and a reactive component, wherein the reactive component comprises a transition metal complex of a fluorinated organic acid. Preferably, the transition metal complex is a chromium complex, and more preferably, the transition metal complex comprises a Werner complex of trivalent chromium and a fluorinated organic carboxylic acid. Most preferably, the fluorinated organic carboxylic acid of the Werner complex is selected from the group consisting of non-cyclic and cyclic carboxylic acids having 4 to 18 carbon atoms.

The choice of the liquid carrier medium for the fluid materials of this invention may vary widely and includes water, organic solvents, and combinations thereof. Suitable organic solvents typically are polar and include, but are not limited to, alcohols, such as isopropyl alcohol; ketones, such as acetone; and, sulfoxides, such as dimethyl sulfoxide. Because of their compatibility with the transition metal complexes of fluorinated organic acids, one or more aliphatic alcohols of 1 to 4 carbon atoms, such as isopropyl alcohol, are preferred, and more preferably, one or more of these alcohols in a mixture with water. The choice of the liquid carrier medium depends mainly on the particular reactive component utilized in the fluid material, on the compatibility of the reactive component with the liquid carrier medium, on the type of method of application of the fluid material to the media with the support having a hydrophilic receiving surface, and on the requirements for wettability and other coating application properties of the particular hydrophilic receiving surface of the media. A wider choice of the liquid carrier medium exists when the fluid material is applied to the full surface of the media by a conventional coating application, such as gap blade coating, reverse roll coating, or gravure coating. A narrower choice of the liquid carrier medium generally exists when the fluid material is applied to the surface of the media using an ink jet printing application, either over the full surface of the media or, preferably, in a desired imagewise pattern. The use of an ink jet printing application introduces further requirements on the liquid carrier medium of compatibility, stability, and consistent performance of the fluid material in the ink jet printing cartridge during storage and during ink jet printing. For special coating application techniques, such as an ink jet printing application, the suitability of the liquid carrier medium typically needs to be determined by experimentation in the particular coating application technique selected and with the complete fluid material composition, including any other additives besides the reactive component, present.

The fluid material may be applied to the receiving surface of the media either on the entire surface or in a pattern on the surface. For use in making waterless printing plates, application of the fluid material on the full surface is typically an intermediate step in making the waterless lithographic printing plate and precedes a subsequent step of either removing the ink-releasing layer on the full surface of the media in selected areas in a desired pattern, such as by laser-induced thermal ablation, or printing upon the ink-releasing layer on the full surface of the media in selected areas in a desired pattern, such as by a laser printing application or by an ink jet printing application. In the case of removing the ink-releasing layer in a desired pattern, this preferably reveals the hydrophilic surface of the media, which is typically suitable for the ink-receptive image areas for use in waterless lithographic printing with the ink-releasing background areas being the areas where the ink-releasing layer was not removed. In the case of printing over the ink-releasing layer in a desired pattern, this preferably provides an ink-receptive pattern, which is typically suitable for the ink-receptive image areas of waterless lithographic printing with the ink-releasing background areas being where the areas where ink-releasing layer was not printed. The preferred reactive component of the media/fluid material sets of the present invention comprises a chromium complex of a fluorinated organic acid.

The media of the media/fluid material sets of this invention comprises a support that bears a hydrophilic receiving surface. A wide variety of hydrophilic receiving surfaces may be utilized in the media A requirement for the hydrophilic receiving surface includes generally that the surface is receptive to the application of the fluid material on the receiving surface in terms of wettability and other desired coatability properties such as coating uniformity; interaction with the reactive component in the fluid material to provide a durable, strongly adhering ink-releasing layer; and the ink-receptive properties needed for high quality waterless lithographic printing if the receiving surface is the desired ink-receptive area in the imaged waterless plates. Unlike wet lithographic printing, the absence of water in waterless lithographic printing systems allows the hydrophilic surface to be ink-receiving. Since the fluid material comprises a reactive component which reacts after application of the fluid material on the hydrophilic receiving surface of the media to form an ink-releasing layer, it is often desirable that a hydrophilic material in the receiving surface has reactivity with the reactive component to further enhance the durability, adhesion, and permanence of the reaction products of the reactive component. For example, some hydrophilic materials obtain some or all of their hydrophilic properties from hydroxyl groups, and these hydroxyl groups may also react with the transition metal complexes of fluorinated organic acids of the media/fluid material sets of this invention after application of the fluid material on the receiving surface, thereby forming a more durable ink-releasing layer on the receiving surface. A hydrophilic receiving surface is also beneficial for the application of the typically polar, and often aqueous-based, fluid materials of this invention to the receiving surface. Suitable hydrophilic materials for the hydrophilic receiving surface include, but are not limited to, polyvinyl alcohol and copolymers thereof; cellulosic polymers; polyacrylates and copolymers thereof; polymethacrylates and copolymers thereof; polymaleic anhydrides and derivatives and copolymers thereof; polyvinyl pyrrolidones and copolymers thereof; quaternary ammonium polymers and copolymers thereof; polyamides; and aluminum oxides. Preferred hydrophilic materials are aluminum oxides, including, but not limited to, aluminum boehmites, gamma-aluminum oxides, alpha-aluminum oxides, aluminum oxides formed by the oxidation of aluminum metal by oxygen; and aluminum oxides formed by an anodization process.

To promote the reaction of the reactive component after application of the fluid material on the receiving surface of the media of the media/fluid material sets of the present invention, the hydrophilic receiving surface may further comprise a catalyst. Preferably, the catalyst is an alkaline material such as, for example, a tertiary amine. The fluid materials of this invention, which comprise transition metal complexes of fluorinated organic acids, are typically acidic, and alkaline materials in the hydrophilic receiving surface generally promote the reaction of these transition metal complexes.

After the fluid material is applied on the hydrophilic receiving surface, the liquid carrier medium is typically removed to leave a solid layer comprising the transition metal complex of a fluorinated organic acid on the hydrophilic receiving surface. This layer is then reacted to form a reaction product of the transition metal complex of a fluorinated organic acid and thereby from a solid ink-releasing layer. FIG. 1 shows the ink-releasing plate of this invention for use in preparing waterless lithographic printing plates. The ink-releasing layer 3 is in contact with the hydrophilic receiving surface 2 of the support 1. This removal of the liquid carrier medium may be accomplished by a variety of conventional means such as, for example, forced ambient or hot air drying and absorption of the liquid carrier medium into the hydrophilic receiving surface.

The reaction of the reactive component after application to the hydrophilic receiving surface may be accomplished by a variety of means. For example, after removal of the liquid carrier medium, the solid layer comprising the transition metal complex, preferably a chromium complex, of a fluorinated organic acid may react at ambient conditions to form a solid ink-releasing layer. Preferably, heat is utilized to react the transition metal complex, preferably a chromium complex, to form the ink-releasing layer. In a most preferred embodiment, the transition metal complex, such as a chromium complex, reacts with the hydrophilic receiving surface to form the ink-releasing layer. The ink-releasing layers of the present invention provide the good mechanical integrity and durability, as well as strong adhesion to the receiving surface, that are useful for waterless lithographic printing plates.

The support of the media of the media/fluid material sets of the present invention may be a number of different substrates, including the types known in the art as substrates for lithographic printing plates. Suitable supports include, but are not limited to, papers, polymeric plastic films, aluminum, steel and chromium. For waterless lithographic printing, a wide variety of papers, including those which are not moisture resistant, may be used. Examples of suitable polymeric plastic films include, but are not limited to, polyester such as polyethylene terephthalate, polycarbonate, polysulfone, and cellulose acetate. These supports by their intrinsic chemical nature may contain a hydrophilic receiving surface on at least one surface such as, for example, the cellulosic surface of a paper or the surface of an aluminum support with aluminum oxides present. Alternatively, these supports may further comprise a hydrophilic layer applied on at least one surface of the support such as, for example, a hydrophilic coating layer comprising a hydrophilic material applied to a polymeric plastic film, such as, for example, to polyethylene terephthalate plastic film.

Aluminum has long been known as a support for both wet and waterless lithographic printing plates. The processes of mechanical and electrochemical graining and of anodizing the surface of the aluminum to improve lithographic printing quality are very well known in the art, as, for example, described in U.S. Pat. No. 5,605,780 and references therein, and in *The Surface Treatment and Finishing of Aluminum and Its Alloys* by Wernick et al., Fifth Edition, Volumes 1 and 2, ASM International, Metals Park, Ohio, 1987. The types of aluminum supports suitable for use in the present invention may vary widely and include, but are not limited to, aluminum which has been grained, aluminum which has been grained and anodized, and aluminum which has been anodized without prior graining.

Ink-Releasing Plates with Fluorinated Ink-Releasing Layers for Use in Preparing Waterless Lithographic Printing Plates The ink-releasing layers of the ink-releasing plates of the present invention, as illustrated in FIG. 1, for use in preparing waterless lithographic printing plates comprise a reaction product of a transition metal complex of a fluorinated organic acid. Preferably, the transition metal complex is a chromium complex, and more preferably, this chromium complex comprises a Werner complex of trivalent chromium and a fluorinated organic carboxylic acid. In a most preferred embodiment, the fluorinated organic carboxylic acid of the Werner complex is selected from the group consisting of non-cyclic and cyclic carboxylic acids having 4 to 18 carbon atoms.

Although the exact chemical structures of the reaction products of the transition metal complexes of the fluorinated organic acids of this invention are not known and may vary widely depending on the nature of the specific starting complex, the presence of reactive materials and catalysts in the hydrophilic receiving surface of the media, and the specific reaction conditions, these reaction products comprise all or a substantial fraction of the fluorine content of the starting complex. For example, where the transition metal complex of the fluorinated organic acid is a Werner complex of trivalent chromium and perfluorooctanoic acid, the reaction product of the complex comprises perfluoroheptyl groups. These long-chain fluoroalkyl groups impart a low surface energy to the ink-releasing layer and provide the ink-releasing properties for waterless lithographic printing inks when the surface energies, as shown by surface tension measurements, are below about 20 dynes/cm. By contrast, although useful in providing an ink-receptive layer for preparing wet lithographic printing plates, the chromium complexes of organic acids such as myristic acid or stearic acid, as described in U.S. Pat. Nos. 5,738,013 and U.S. Pat. No. 5,849,066, do not provide ink-releasing properties for waterless lithographic printing since the non-fluorinated fatty groups do not impart a sufficiently low surface energy.

As is well known in the art and as indicated by the term "surface energy," in order to be effective in providing low surface energies, the fluorinated or other low energy materials need to be on the surface of the ink-releasing layer. Due to the low surface energy properties of highly fluorinated organic materials, they tend to become more concentrated at the surface (the layer-air interface) of the layer containing these materials and, consequently, less concentrated in the bulk of the layer. This tendency for buildup of the fluorinated materials at the surface is useful in obtaining the level of fluorinated functional groups in the surface needed for ink-releasing properties for waterless lithographic printing. The level and general type of the fluorinated functional groups on the surface may be determined by conventional spectroscopy techniques, such as, for example, a combination of ESCA (Electron Spectroscopy for Chemical Analysis) and Auger spectroscopy.

Suitable hydrophilic materials for the hydrophilic surface of the supports of the ink-releasing plates of the present invention for use in preparing waterless lithographic printing plates, which hydrophilic surface is in contact with the ink-releasing layer, include, but are not limited to: polyvinyl alcohol and copolymers thereof; cellulosic polymers; polyacrylates and copolymers thereof; polymethacrylates and copolymers thereof; polymaleic anhydrides and derivatives and copolymers thereof; polyvinyl pyrrolidones and copolymers thereof; quaternary ammonium polymers and copolymers thereof; polyamides; and aluminum oxides. Suitable aluminum oxides include, but are not limited to, aluminum boehmites; gamma-aluminum oxides; alpha-aluminum oxides; aluminum oxides formed by the oxidation of aluminum metal by oxygen; and aluminum oxides formed by an anodization process.

In a most preferred embodiment of the ink-releasing plates of the present invention for use in preparing waterless lithographic printing plates, the reaction product of the transition metal complex and fluorinated organic acid comprises a reaction product of this complex with the hydrophilic surface of the support.

Suitable supports for the ink-releasing plates of this invention for use in preparing waterless lithographic printing plates include, but are not limited to, papers, polymeric plastic films, aluminum, steel and chromium.

Figure 2:
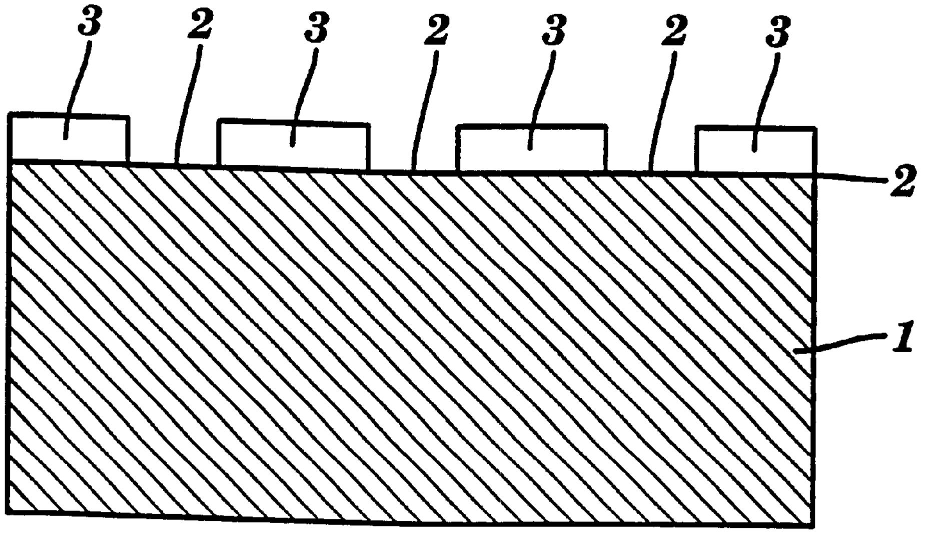
FIG. 2 shows a cross-section of an imaged waterless lithographic printing plate of the present invention where an imagewise pattern of an ink-releasing layer is in contact with an ink-receiving hydrophilic surface of a support.

Waterless Lithogaphic Printing Plates for Laser-Induced Thermal Ablation Imaging The ink-releasing layers of the waterless lithographic printing plates of the present invention may be converted into imaged waterless lithographic printing plates by a variety of imaging methods such as, for example, a laser printing application, an ink jet printing application, and a laser-induced thermal ablation imaging application. For example, the laser printing and ink jet printing applications apply a desired imagewise pattern of material comprising an ink-receptive material which results in an ink-receiving area for waterless lithographic printing in the desired imagewise pattern while the background areas not printed by the laser printing or ink jet printing retain their ink-releasing properties. Also, for example, laser-induced thermal ablation imaging may remove the ink-releasing layer in a desired imagewise pattern in the areas exposed to the laser to reveal or uncover a higher surface energy surface which is not ink-releasing and is ink-receiving, as illustrated in FIG. 2, where, for example, the ink-releasing layer 3 has been removed by the ablation in certain desired areas to expose the ink-receptive surface 2 of the support 1 in a desired imagewise pattern. This new surface after laser induced thermal ablation may be a higher surface energy intermediate surface in the bulk of the original image-forming layer before laser imaging. Preferably, this new surface after laser induced thermal ablation is a hydrophilic surface of the support, and this new hydrophilic surface has ink-receiving properties for waterless lithographic printing inks. This new hydrophilic surface may be the original hydrophilic surface to which the ink-releasing layer is contacted or, alternatively, the new hydrophilic surface may be a hydrophilic layer in the bulk of the support below the original hydrophilic surface.

The laser-induced thermal ablation of the waterless lithographic printing plates of the present invention may be carried out using a wide variety of laser imaging techniques known in the art of laser-induced thermal ablation, including, but not limited to, the use of continuous and pulsed laser sources, and the use of laser radiation of various ultraviolet, visible, and infrared wavelengths. Preferably, the laser-induced thermal ablation of this invention is carried out using a continuous laser source of either visible or infrared radiation, such as, for example, with a YAG laser at its normal wavelength (1065 nm) or at its frequency-doubled wavelength (532 nm) or with a diode laser emitting at 830 nm.

To increase the rate of imaging and the effectiveness of the laser-induced thermal ablation, the ink-releasing image-forming layer preferably further comprises a sensitizer that absorbs the wavelength of the incident laser radiation. For example, a useful sensitizer is a carbon black which absorbs across the ultraviolet, visible, and infrared wavelength regions. Other useful sensitizers include, but are not limited to, organic dyes that have a high extinction coefficient of absorption and very rapidly convert any absorbed photons into heat in order to provide an efficient temperature buildup for ablation in the ink-releasing layer. An example of these organic dyes is IR 165, a tradename for a highly infrared-absorbing aminum dye from Deloz Safety, Lakeland, Fla. which may be utilized with lasers with infrared radiation wavelengths out to about 1300 nm and preferably with YAG lasers with an exposure wavelength of 1065 nm.

For waterless lithographic printing plates of the present invention for imaging by laser-induced thermal ablation, suitable supports include, but are not limited to, papers, polymeric plastic films, aluminum, steel, and chromium.

Imaged Waterless Lithographic Printing Plates

One aspect of the imaged waterless lithographic printing plates of the present invention pertains to imaged waterless lithographic printing plates which comprise (a) a support that bears a hydrophilic surface in the ink-receiving areas of the support; and, (b) an ink-releasing layer in a desired imagewise pattern overlying the hydrophilic surface of the support, which ink-releasing layer comprises a reaction product of a transition metal complex of a fluorinated organic acid. FIG. 2 illustrates this aspect of the imaged waterless lithographic printing plates of this invention where the ink-releasing layer 3 is in a desired imagewise pattern overlying the ink-receptive surface 2 of the support 1. As described herein, suitable methods to obtain these imaged waterless lithographic printing plates include, but are not limited to, laser-induced thermal ablation of an ink-releasing layer in a desired imagewise pattern to reveal the hydrophilic surface of the support and ink jet printing application of an ink-releasing layer in a desired imagewise pattern on the support. As described herein, the reaction product of a transition metal complex of a fluorinated organic acid has fluorinated functional groups that provide the low surface energy properties needed for use with waterless lithographic printing inks. Preferably, the transition metal complex is a chromium complex, and more preferably, the chromium complex comprises a Werner complex of trivalent chromium and a fluorinated organic carboxylic acid. Most preferably, the fluorinated organic carboxylic acid of the Werner complex is selected from the group consisting of non-cyclic and cyclic carboxylic acids having 4 to 18 carbon atoms.

Suitable hydrophilic materials in the non-imaged areas of the support include, but are not limited to, polyvinyl alcohol and copolymers thereof; cellulosic polymers; polyacrylates and copolymers thereof; polymethacrylates and copolymers thereof; polymaleic anhydrides and derivatives and copolymers thereof; polyvinyl pyrrolidones and copolymers thereof; quaternary ammonium polymers and copolymers thereof; polyamides; and aluminum oxides. Suitable aluminum oxides include, but are not limited to, aluminum boehmites; gamma-aluminum oxides; alpha-aluminum oxides; aluminum oxides formed by the oxidation of aluminum metal by oxygen; and aluminum oxides formed by an anodization process. Most preferably, the hydrophilic materials in the hydrophilic surface of the support form a reaction product with the transition metal complex of a fluorinated organic acid in the ink-releasing areas of the imaged waterless lithographic printing plates.

Suitable supports for the imaged waterless lithographic printing plates of the present invention include, but are not limited to, papers, polymeric plastic films, aluminum, steel, and chromium.

Methods of Preparing an Ink-Releasing Plate for Use in Preparing a Waterless Lithographic Printing Plate One aspect of the present invention pertains to methods of preparing an ink-releasing plate for use in preparing a waterless lithographic printing plate, which methods comprise the steps of (a) providing a support that bears a hydrophilic receiving surface, as described herein; (b) applying a fluid material comprising a liquid carrier medium and a reactive component, which reactive component comprises a transition metal complex of a fluorinated organic acid, as described herein, to the receiving surface; (c) removing the liquid carrier medium; and, (d) reacting the reactive component, thereby forming an ink-releasing layer on the receiving surface. Preferably, this transition metal complex is a chromium complex, and more preferably, this chromium complex comprises the Werner complex of trivalent chromium and a fluorinated organic carboxylic acid. In a preferred embodiment of the methods of preparing the ink-releasing plates of this invention for use in preparing waterless lithographic printing plates, the fluorinated organic carboxylic acid of the Werner complex is selected from the group consisting of noncyclic and cyclic carboxylic acids having 4 to 18 carbon atoms.

The application of the fluid material to the hydrophilic receiving surface may be done by a variety of techniques, including conventional coating techniques such as, for example, reverse roll coating, gravure coating, slot extrusion coating, gap blade coating, and dip coating. Also, the fluid material may be an ink jet fluid marking material and the application of this fluid material to the receiving surface, whether it is a full coverage of the surface or a designed imagewise pattern, may be carried out by an ink jet printing application, such as on a commercially available ink jet printer utilizing one of the conventional ink jet printing techniques such as, for example, thermal ink jet printing, piezoelectric ink jet printing, or continuous ink jet printing.

In a preferred embodiment, the reactive component in step (d) of the methods of preparing the ink-releasing plates of the present invention for use in preparing waterless lithographic printing plates reacts upon the exposure to heat. In a most preferred embodiment, the reactive component in step (d) of the methods of preparing the ink-releasing plates for use in preparing the waterless lithographic printing plates of this invention reacts with the hydrophilic receiving surface of the support.

Suitable supports for the methods of preparing the ink-releasing plates of the present invention for use in preparing waterless lithographic printing plates include, but are not limited to, papers, polymeric plastic films, aluminum, steel, and chromium.

Methods of Preparing Imaged Waterless Lithographic Printing Plates by Ink Jet Printing Applications One aspect of the present invention pertains to methods of preparing imaged waterless lithographic printing plates, which methods comprise providing a lithographic plate blank having a support that bears a hydrophilic receiving surface and forming an image on the hydrophilic receiving surface of the support with an ink jet printer in an ink jet printing application, wherein the ink jet fluid marking material utilized in the ink jet printer comprises a liquid carrier medium and a reactive component. This reactant component comprises a transition metal complex of a fluorinated organic acid, as described herein, and reacts upon exposure to an energy source after ink jet printing, thereby forming an ink-releasing layer in a desired pattern on the support. Preferably, the transition metal complex is a chromium complex, and more preferably, this chromium complex comprises a Werner complex of trivalent chromium and a fluorinated organic carboxylic acid. Most preferably, the fluorinated organic carboxylic acid of the Werner complex is selected from the group consisting of non-cyclic and cyclic carboxylic acids having 4 to 18 carbon atoms.

In a most preferred embodiment, the ink jet printing application of the methods of preparing imaged waterless lithographic printing plates of the present invention is done in a desired imagewise pattern on the hydrophilic receiving surface of the support, and the ink-releasing layer is formed in the desired imagewise pattern on the support.

A variety of energy sources may be used to react the reactive component, such as, for example, ultraviolet radiation, infrared radiation, and even the energy available from ambient temperature conditions over a period of time such as, for example, 1 hour or 5 days. In a preferred embodiment, the energy source used to react the reactive component is heat. In a most preferred embodiment, the reactive component reacts with the hydrophilic receiving surface.

Suitable supports for the methods of preparing the imaged waterless lithographic printing plates by ink jet printing applications of the present invention include, but are not limited to, papers, polymeric plastic films, aluminum, steel, and chromium.

Methods of Preparing Imaged Waterless Lithogaphic Printing Plates by Laser-Induced Thermal Ablation One aspect of the present invention pertains to methods of preparing imaged waterless lithographic printing plates, which methods comprise the steps of (a) to (d) of the methods of preparing an ink-releasing plate for use in preparing a waterless lithographic printing plate, as described hereinabove, followed by a subsequent step (e) of exposing the ink-releasing layer to laser-induced thermal ablation in a desired imagewise pattern, thereby removing the ink-releasing layer in the exposed regions to thereby reveal the hydrophilic surface of the support or, alternatively, another ink-receiving surface, in the desired imagewise pattern. Preferably, the transition metal complex of the methods of preparing imaged waterless lithographic printing plates by laser-induced thermal ablation of this invention is a chromium complex, and more preferably, this chromium complex comprises a Werner complex of trivalent chromium and a fluorinated organic carboxylic acid. Most preferably, this fluorinated organic carboxylic acid of the Werner complex is selected from the group consisting of non-cyclic and cyclic organic carboxylic acids having 4 to 18 carbon atoms.

Suitable hydrophilic materials for the hydrophilic receiving surface of the support of the methods of preparing imaged waterless lithographic printing plates by laser-induced thermal ablation of the present invention include, but are not limited to, polyvinyl alcohol and copolymers thereof; cellulosic polymers; polyacrylates and copolymers thereof; polymethacrylates and copolymers thereof; polymaleic anhydrides and derivatives and copolymers thereof; polyvinyl pyrrolidones and copolymers thereof; quaternary ammonium polymers and copolymers thereof; polyamides; and aluminum oxides. Suitable aluminum oxides include, but are not limited to, aluminum boehmites; gamma-aluminum oxides; alpha-aluminum oxides; aluminum oxides formed by oxidation of aluminum metal by air or oxygen; and aluminum oxides formed by an anodization process. In one embodiment, the ink-releasing layer comprises a reaction product of the transition metal complex of a fluorinated organic acid with the hydrophilic surface of the support.

Suitable supports for the method of preparing waterless lithographic printing plates by laser-induced thermal ablation of the present invention include, but are not limited to, papers, polymeric plastic films, aluminum, steel, and chromium.

While the invention has been described in detail and with reference to specific embodiments thereof, it will be apparent to one skilled in the art that various changes and modifications can be made without departing from the spirit and scope thereof.

What is claimed is:

1. A laser-imageable waterless lithographic printing plate, comprising:

(a) a support that bears a first ink-receptive surface; and, (b) an ink-releasing surface layer overlying said support: said ink-releasing layer comprising a reaction product of a transition metal complex of a fluorinated organic acid;

wherein said plate is capable of being imaged using a laser-induced thermal ablation process, which ablation process removes said ink-releasing layer in exposed regions thereof to thereby reveal an ink-receptive surface of said support; and wherein the ink-receptive surface after the laser-induced thermal ablation imaging process is a hydrophilic layer in the bulk of said support below said first ink-receptive surface.

2. The plate of claim 1, wherein said plate further comprises a sensitizer to increase the rate of imaging by said laser-induced thermal ablation process.

3. The plate of claim 2, wherein said sensitizer is an infrared-absorbing material.

4. The plate of claim 2, wherein said sensitizer is a carbon black.

5. A method of preparing an imaged waterless lithographic printing plate, comprising the steps of:

(a) providing a support that bears a first ink-receptive surface;

(b) applying a fluid material comprising a liquid carrier medium and a reactive component, which reactive component comprises a transition metal complex of a fluorinated organic acid, to said first ink-receptive surface;

(c) removing said liquid carrier medium;

(d) reacting said reactive component, thereby forming a waterless lithographic printing plate having an ink-releasing layer on said first ink-receptive surface; and (e) exposing said plate to a laser-induced thermal ablation process in a desired imagewise pattern, thereby removing said ink-releasing layer in the exposed regions thereof to thereby reveal an ink-receptive surface of said support in said desired imagewise pattern.

6. The method of claim 5, wherein the ink-receptive surface after the laser-induced thermal ablation imaging process of step (e) is the same as said first ink-receptive surface of step (a) before said imaging process.

7. The method of claim 5, wherein the ink-receptive surface after the laser-induced thermal ablation imaging process of step (e) is a hydrophilic layer in the bulk of said support below said first ink-receptive surface of step (a).

8. The method of claim 5, wherein said transition metal complex is a chromium complex.

9. The method of claim 8, wherein said chromium complex comprises a Werner complex of trivalent chromium and a fluorinated organic carboxylic acid.

10. The method of claim 9, wherein said fluorinated organic carboxylic acid is selected from the group consisting of non-cyclic and cyclic organic carboxylic acids having 4 to 18 carbon atoms.

11. The method of claim 5, wherein the hydrophilic surface of said support comprises a hydrophilic material selected from the group consisting of polyvinyl alcohol and copolymers thereof; cellulosic polymers; polyacrylates and copolymers thereof; polymethacrylates and copolymers thereof, polymaleic anhydrides and derivatives and copolymers thereof; polyvinyl pyrrolidones and copolymers thereof; quaternary ammonium polymers and copolymers thereof, polyamides; and aluminum oxides.

12. The method of claim 11, wherein said aluminum oxides are selected from the group consisting of aluminum boehmites; gamma-aluminum oxides; alpha-aluminum oxides; aluminum oxides formed by the oxidation of aluminum metal by oxygen; and aluminum oxides formed by an anodization process.

13. The method of claim 5, wherein said ink-releasing layer comprises a reaction product of the transition metal complex of a fluorinated organic acid with the ink-receptive surface of said support.

14. The method of claim 5, wherein said support comprises a paper.

15. The method of claim 5, wherein said support comprises a polymeric plastic film.

16. The method of claim 5, wherein said support comprises aluminum.

17. The method of claim 5, wherein said plate of step (d) further comprises a sensitizer to increase the rate of imaging by said laser-induced thermal ablation process.

18. The method of claim 17, wherein said sensitizer is an infrared-absorbing material.

19. The method of claim 17, wherein said sensitizer is a carbon black.

* * * * *